US006855989B1

(12) United States Patent
Wang et al.

(10) Patent No.: US 6,855,989 B1
(45) Date of Patent: Feb. 15, 2005

(54) DAMASCENE FINFET GATE WITH SELECTIVE METAL INTERDIFFUSION

(75) Inventors: Haihong Wang, Milpitas, CA (US); Shibly S. Ahmed, San Jose, CA (US); Ming-Ren Lin, Cupertino, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/674,520

(22) Filed: Oct. 1, 2003

(51) Int. Cl.$^7$ .............................................. H01L 27/01
(52) U.S. Cl. ...................... 257/349; 257/249; 257/250; 257/270; 257/314; 257/347; 257/385; 257/407; 438/588; 438/193; 438/201; 438/149; 438/282
(58) Field of Search ................................ 257/244, 249, 257/250, 270, 314, 330, 347, 349, 385, 407

(56) References Cited

U.S. PATENT DOCUMENTS

| | | | |
|---|---|---|---|
| 4,319,395 A | 3/1982 | Lund et al. ..................... 29/571 |
| 4,399,605 A | 8/1983 | Dash et al. ..................... 29/571 |
| 6,391,750 B1 | 5/2002 | Chen et al. .................. 438/583 |
| 6,451,693 B1 | 9/2002 | Woo et al. ................... 438/682 |
| 6,589,836 B1 | 7/2003 | Wang et al. ................. 438/231 |
| 6,657,259 B2 | 12/2003 | Fried et al. .................. 257/350 |
| 6,800,905 B2 * | 10/2004 | Fried et al. .................. 257/351 |
| 6,803,631 B2 * | 10/2004 | Dakshina-Murthy et al. ............... 257/349 |
| 2001/0045589 A1 | 11/2001 | Takeda et al. ............... 257/297 |
| 2002/0088971 A1 | 7/2002 | Tezuka et al. ................. 257/19 |
| 2004/0038464 A1 | 2/2004 | Fried et al. .................. 438/151 |
| 2004/0048424 A1 | 3/2004 | Wu et al. .................... 438/154 |

OTHER PUBLICATIONS

Copy of co-pending U.S. Appl. No. 10/857,931; by Haihong Wang et al.; filed Jun. 2, 2004; 21 page specification; 20 sheets of drawings.

Digh Hisamoto et al.: "FinFET—A Self–Aligned Double–Gate MOSFET Scalable to 20 nm," IEEE Transactions on Electron Devices, vol. 47, No. 12, Dec. 2000, pp. 2320–2325.

Yang–Kyu Choi et al.: "Sub–20nm CMOS Fin FET Technologies," 2001 IEEE, IEDM, pp. 421–424.

Xuejue Huang et al.: "Sub–50 nm P–Channel Fin FET," IEEE Transactions on Electron Devices, vol. 48, No. 5, May 2001, pp. 880–886.

Yang–Kyu Choi et al.: "Nanoscale CMOS Spacer FinFET for the Terabit Era," IEEE Electron Device Letters, vol. 23, No. 1, Jan. 2002, pp. 25–27.

Xuejue Huang et al.: "Sub 50–nm FinFET: PMOS," 1999 IEEE, IEDM, pp. 67–70.

Co-pending U.S. Appl. No. 10/614,001, filed Jul. 8, 2003, entitled: "Selective Silicidation of Gates in Semiconductor Devices to Achieve Multiple Threshold Voltages"; Shibly S. Ahmed et al.; 20 page specification, 8 sheets of drawings.

* cited by examiner

Primary Examiner—David Nelms
Assistant Examiner—Andy Huynh
(74) Attorney, Agent, or Firm—Harrity & Snyder, LLP

(57) ABSTRACT

A fin field effect transistor includes a fin, a source region, a drain region, a first gate electrode and a second gate electrode. The fin includes a channel. The source region is formed adjacent a first end of the fin and the drain region is formed adjacent a second end of the fin. The first gate electrode includes a first layer of metal material formed adjacent the fin. The second gate electrode includes a second layer of metal material formed adjacent the first layer. The first layer of metal material has a different work function than the second layer of metal material. The second layer of metal material selectively diffuses into the first layer of metal material via metal interdiffusion.

19 Claims, 19 Drawing Sheets

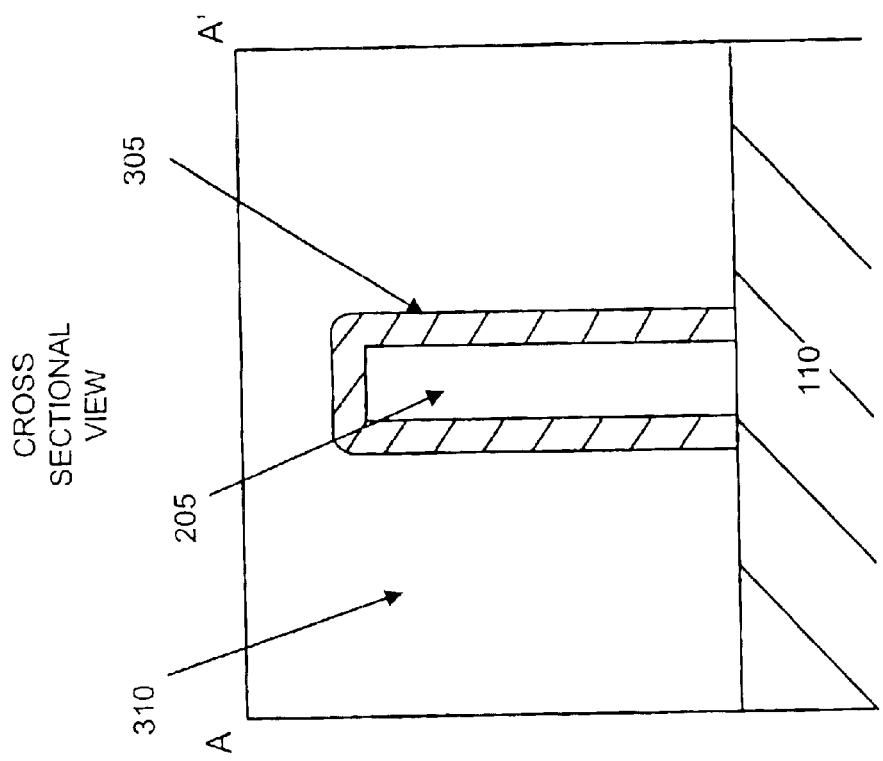
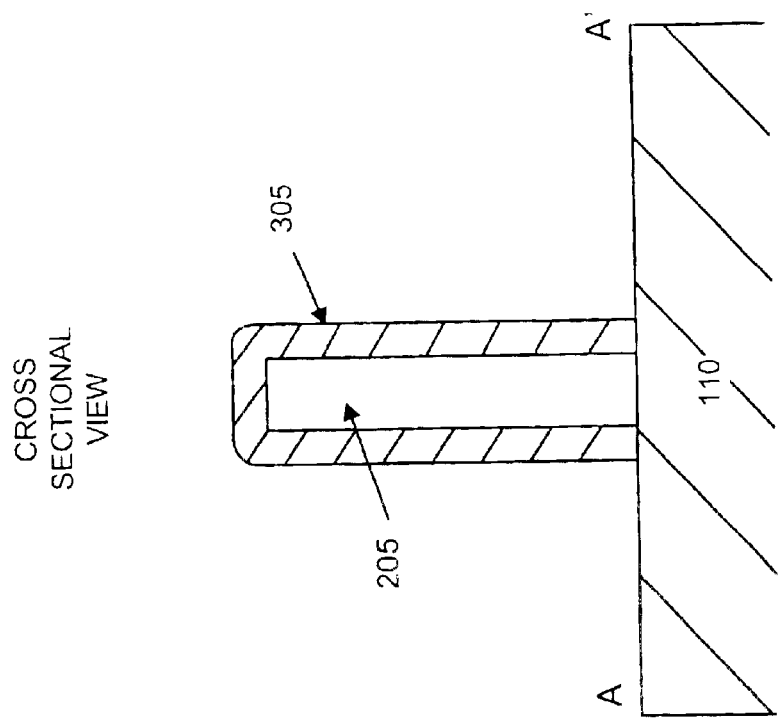
FIG. 3B
FIG. 3A

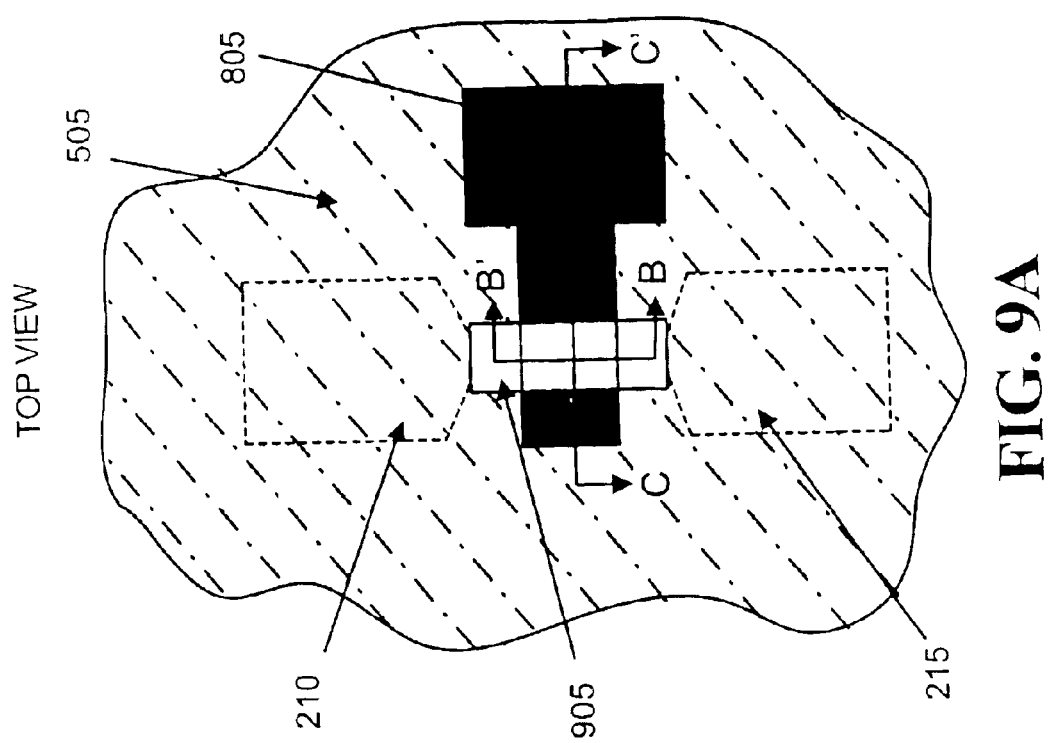

DAMASCENE FINFET GATE WITH SELECTIVE METAL INTERDIFFUSION

TECHNICAL FIELD

The present invention relates generally to transistors and, more particularly, to fin field effect transistors (FinFETs).

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are, therefore, being explored to improve FET performance and allow further device scaling.

Double-gate MOSFETs represent structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a FinFET that includes a gate having layers of different metal materials. In some implementations, a metal material in a first layer of the FinFET gate may be selected such that it has a different work function than a second metal material in a second layer of the FinFET gate. Due to the diffusivity of the second metal material in the first metal material, after annealing, the second metal material may selectively diffuse through the first metal material. The use of different metals for forming adjacent gate layers over a fin may effectively create two FinFET devices with different threshold voltages ($V_t$). The first metal material may be associated with a first threshold voltage ($V_{t1}$) and the second metal material may be associated with a second threshold voltage ($V_{t2}$). Selective metal interdiffusion, thus, creates two adjacent gate electrode layers for a FinFET that have different gate work functions and which, in turn, have different voltage thresholds ($V_t$). A FinFET device with multiple voltage thresholds permits the optimization of drive current and/or leakage current for different circuit paths.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a fin field effect transistor. The fin field effect transistor includes a fin that further includes a channel, a source region formed adjacent a first end of the fin, and a drain region formed adjacent a second end of the fin. The fin field effect transistor further includes a first layer of metal material that includes a first gate electrode, where the first layer of metal material is formed adjacent the fin. The fin field effect transistor also includes a second layer of metal material formed adjacent the first layer, where the second layer of metal material includes a second gate electrode and where the first layer of metal material includes a different work function than the second layer of metal material. The second layer of metal material is further selectively diffused into the first layer of metal material via metal interdiffusion.

According to another aspect of the invention, a method of forming a multiple voltage threshold fin field effect transistor (finFET) is provided. The method includes forming a fin and forming a source region adjacent a first end of the fin and a drain region adjacent a second end of the fin. The method further includes forming a dummy gate that includes a first material in a first pattern over the fin and forming a dielectric layer adjacent sides of the dummy gate. The method also includes removing the first material to form a trench in the dielectric layer corresponding to the first pattern and forming a first metal gate layer in the trench, where the first metal gate layer includes a first metal material. The method additionally includes forming a second metal gate layer in the trench adjacent the first metal gate layer, where the second metal gate layer includes a second metal material and where the second metal material selectively diffuses through the first metal material via metal interdiffusion to produce a multiple voltage threshold finFET.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 3A and 3B illustrate cross-sectional views of dummy oxide and a polysilicon layer formed over the fin of FIG. 2B consistent with the invention;

FIGS. 9A and 9B illustrate formation of a photoresist layer over the first metal gate layer of FIGS. 8A, 8B and 8C consistent with the invention;

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Consistent with the present invention, an exemplary damascene process for forming a FinFET is provided. In the exemplary damascene process, a dummy gate may be formed from a layer of semi-conducting material, such as, for example, polysilicon, that has been formed over a fin. A dielectric layer may then be formed over the FinFET fin, source and drain regions around the dummy gate. The dummy gate may then be removed to create a gate trench in the dielectric layer. A first layer of a first metal material may be formed within the gate trench. A second layer of a second metal material may be formed within the gate trench adjacent the first layer. The first metal material and the second metal material may have different work functions such that, after metal interdiffusion of the second metal material into the first metal material, a FinFET device with different threshold voltages ($V_t$) may be created, with the first metal material being associated with a first threshold voltage ($V_{t1}$) and the second metal material being associated with a second threshold voltage ($V_{t2}$).

Figure 1:
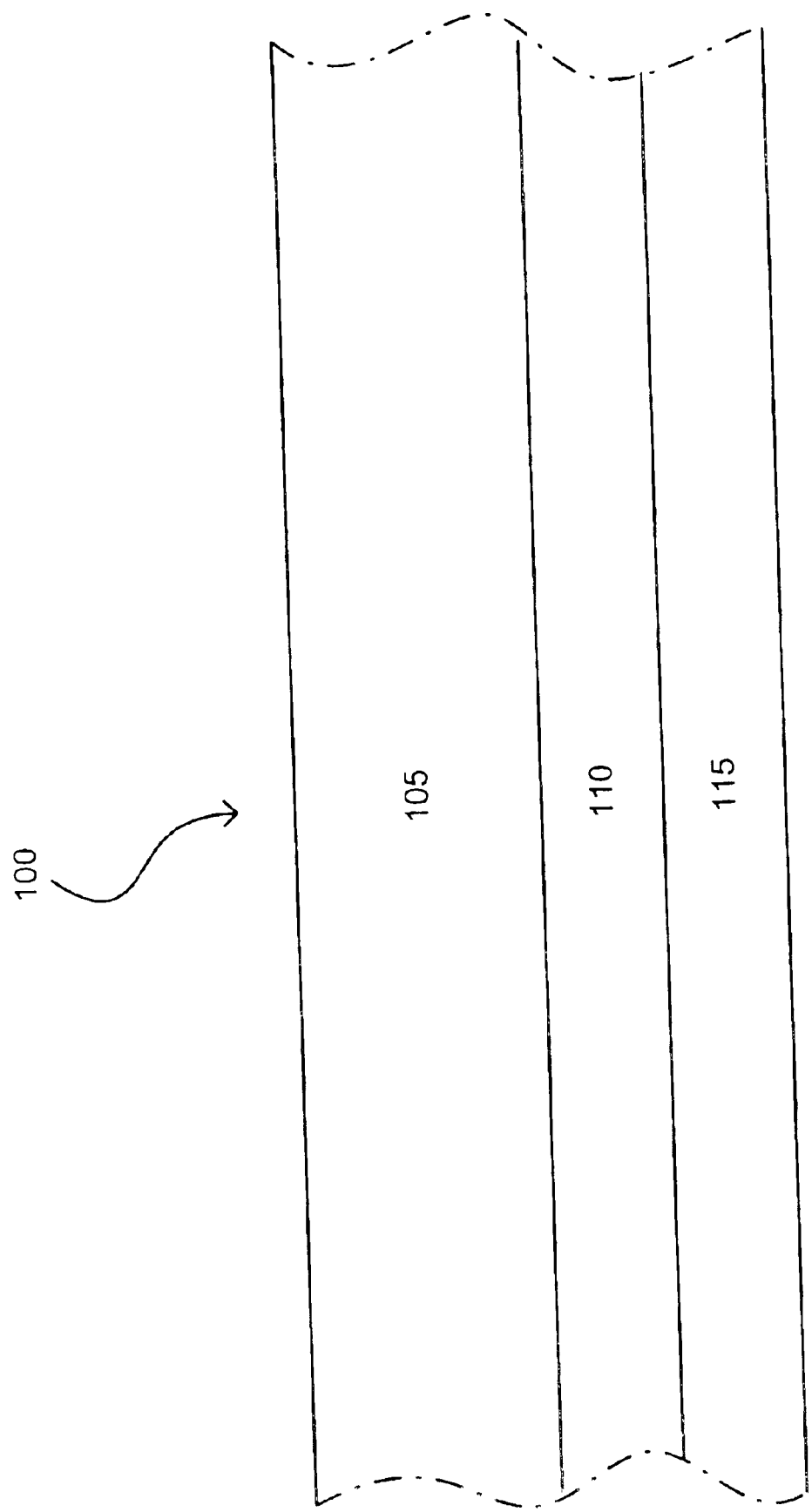
FIG. 1 illustrates exemplary layers of a silicon-on-insulator (SOI) wafer that may be used for forming a fin of a FinFET consistent with the present invention.

FIG. 1 illustrates a cross-section of a silicon-on-insulator (SOI) wafer 100 formed in accordance with an exemplary embodiment of the present invention. SOI wafer 100, consistent with the present invention, may include a buried oxide layer 110 formed on a substrate 115. A fin layer 105 may further be formed on buried oxide layer 110. The thickness of fin layer 105 may range, for example, from about 500 Å to about 2000 Å and the thickness of buried oxide layer 110 may range, for example, from about 1000 Å to about 3000 Å. Fin layer 105 and substrate 115 may include, for example, silicon, though other semi-conducting materials, such as germanium, may be used.

Figure 2A:
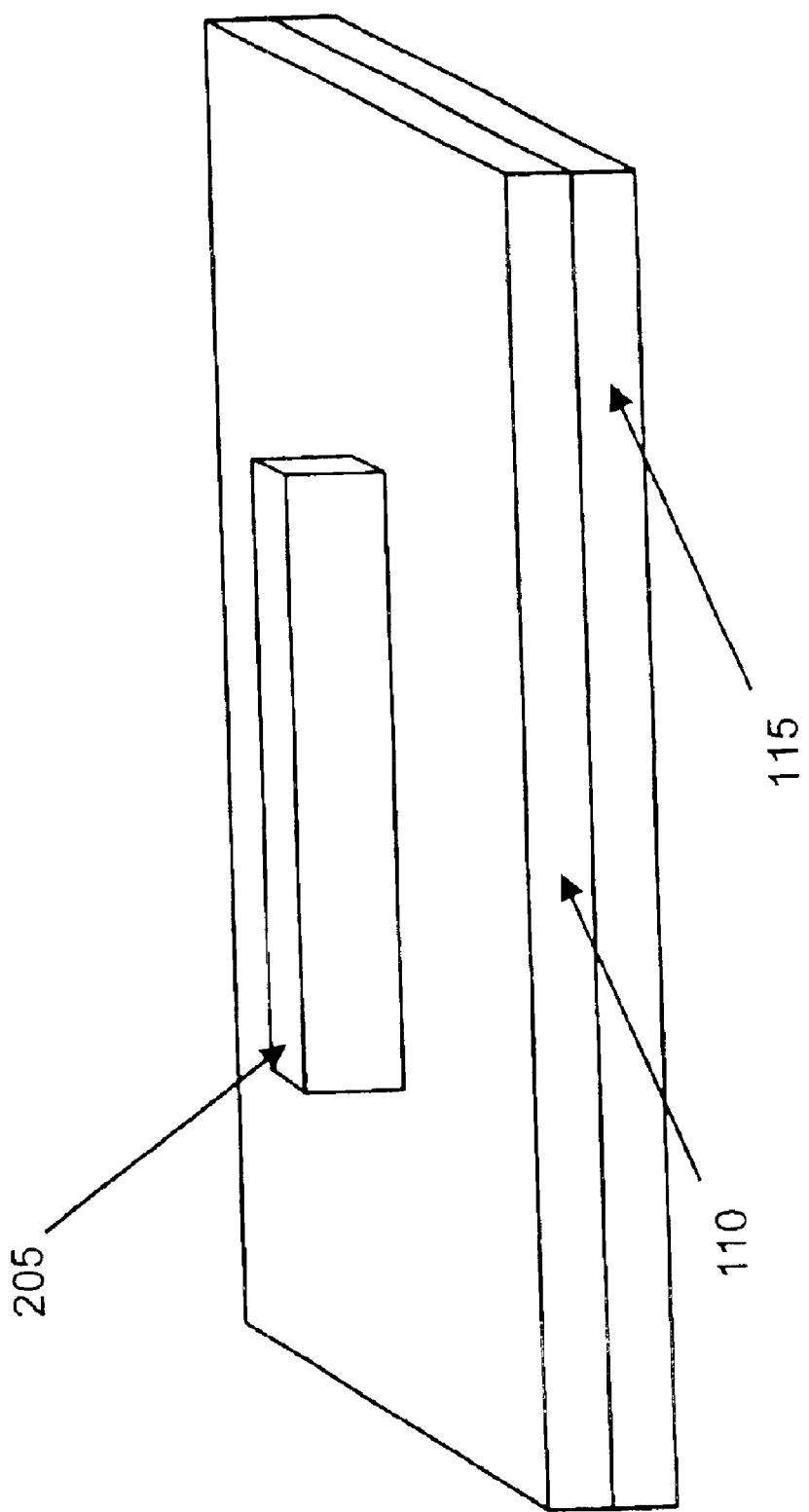
FIG. 2A illustrates an exemplary fin consistent with the invention.
Figure 2D:
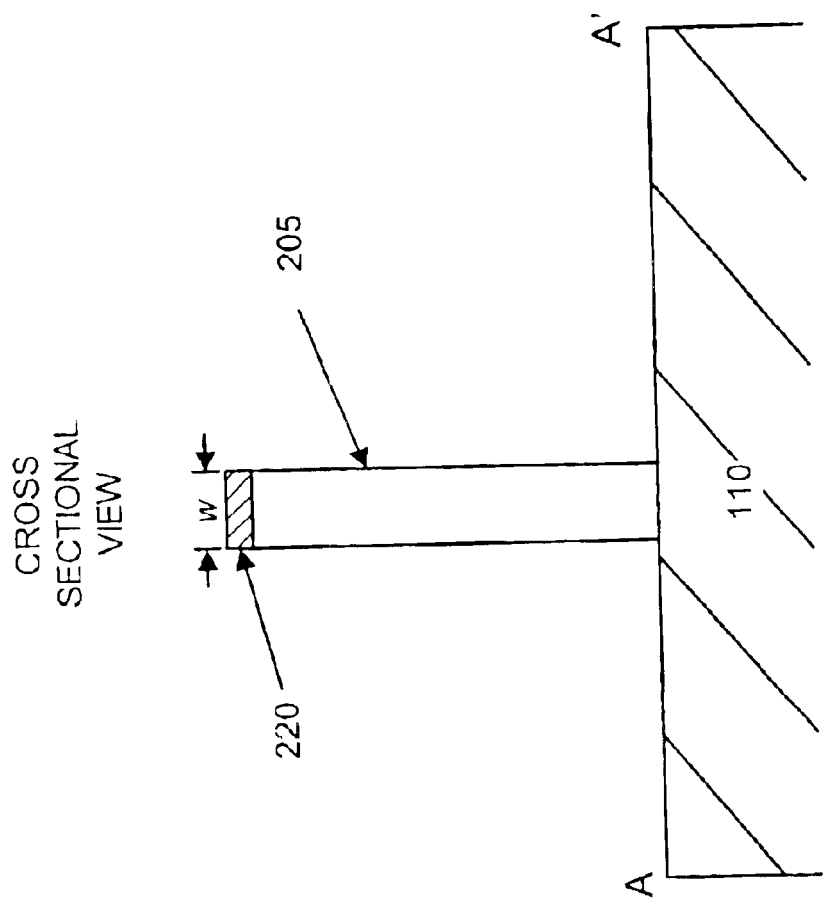
FIG. 2D illustrates a cross-sectional view of the exemplary fin of FIG. 2A consistent with the invention.

As shown in FIGS. 2A and 2D, a vertical fin 205 maybe formed from fin layer 105. Fin 205 may be formed, for example, with a width (w) in a range of 10–15 nm. Fin 205 may be formed from fin layer 105 using any conventional process, including, but not limited to, conventional photolithographic and etching processes.

Figure 2B:
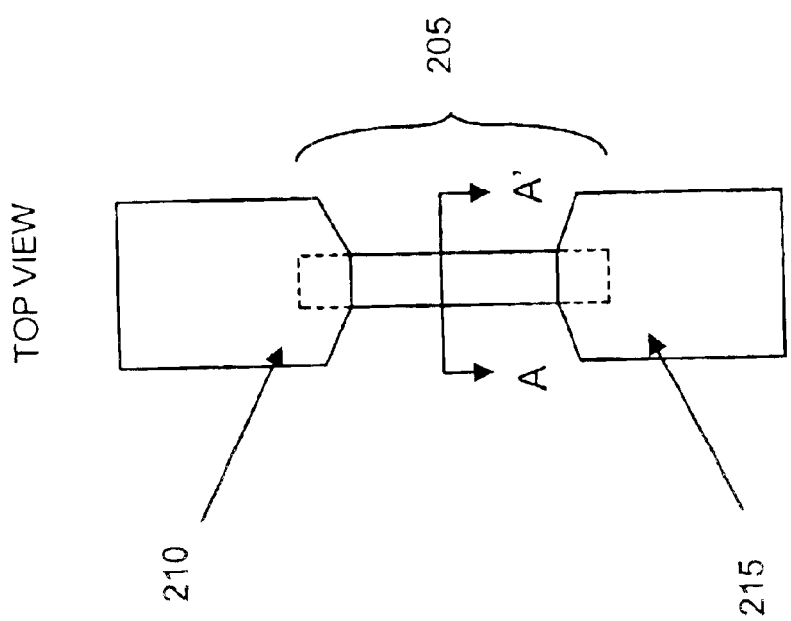
FIGS. 2B and 2C illustrate source and drain regions formed adjacent the fin of FIG. 2A consistent with the invention.
Figure 2C:
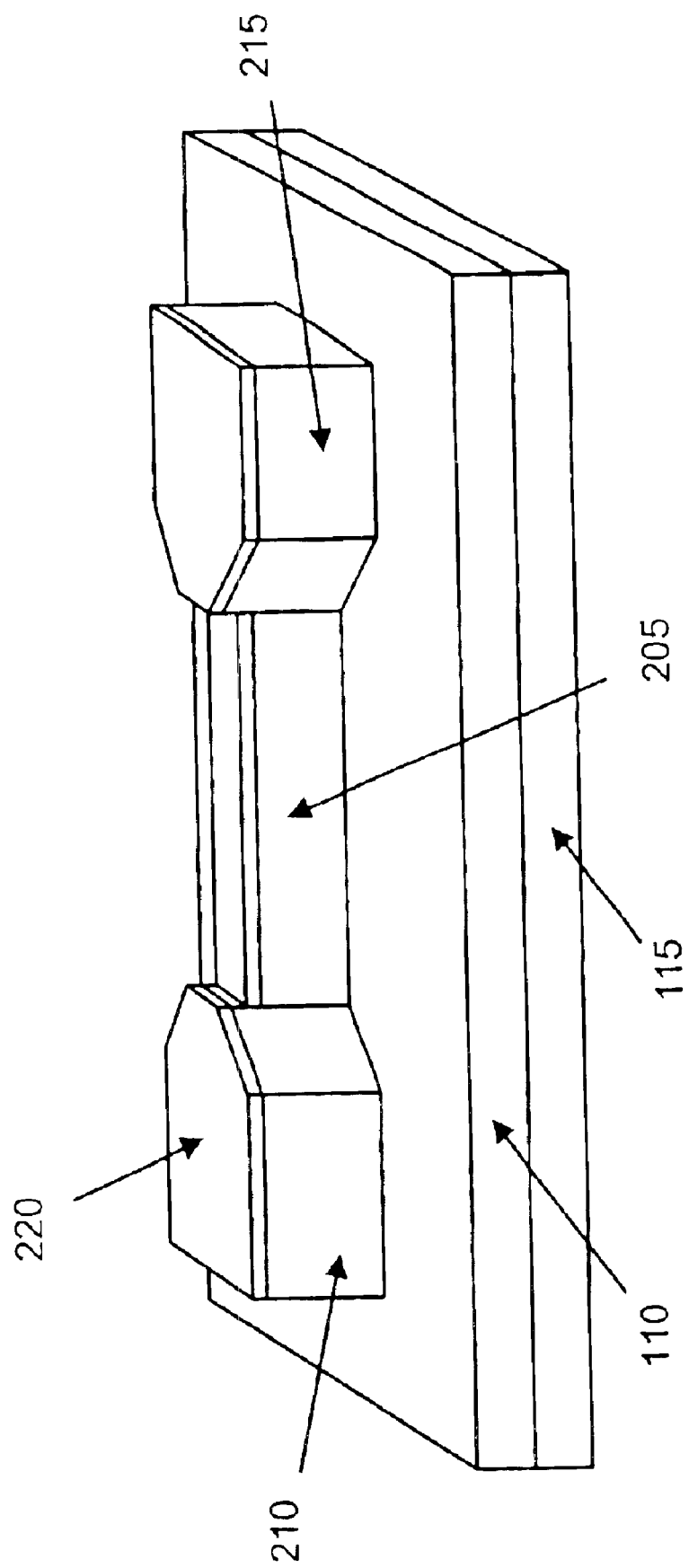

Subsequent to formation of fin 205, source 210 and drain 215 regions may be formed adjacent respective ends of fin 205, as shown in FIGS. 2B and 2C. Source 210 and drain 215 regions may be formed by, for example, deposition of a layer of semi-conducting material over fin 205. The source 210 and drain 215 regions may be formed from the layer of semi-conducting material using, for example, conventional photolithographic and etching processes. One skilled in the art will recognize, however, that other existing techniques may be used for forming source 210 and drain 215 regions. For example, source 210 and drain 215 regions may be formed by patterning and etching fin layer 105. Source 210 and drain 215 regions may include a semi-conducting material such as, for example, silicon, germanium or silicon-germanium (Si—Ge). In one implementation, $Si_xGe_{(1-x)}$, with x approximately equal to 0.7 may be used. A cap 220 may then be formed on upper surfaces of fin 205, source 210 and drain 215, as illustrated in FIG. 2D. Cap 220 may include an oxide, such as, for example, silicon oxide, and may range, for example, from about 100 Å to about 500 Å in thickness.

After formation of source 210 and drain 215 regions, dummy oxide 305 may be formed on fin 205, source 210 and drain 215 using a conventional process, as shown in FIG. 3A. Dummy oxide 305, for example, may be thermally grown on fin 205, source 210 and drain 215. Dummy oxide 305 may include an oxide, such as, for example, silicon oxide and may range, for example, from about 100 Å to about 500 Å in thickness.

Figure 4B:
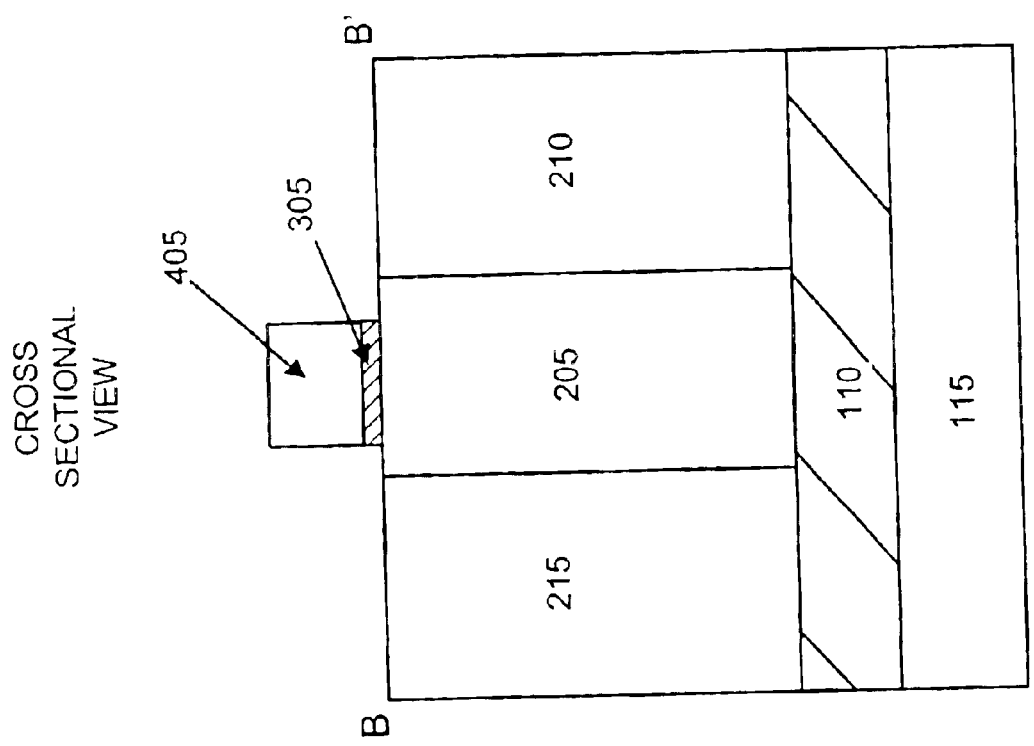
FIGS. 4A and 4B illustrate the formation of a dummy gate from the polysilicon layer of FIG. 3B consistent with the invention.
Figure 4A:
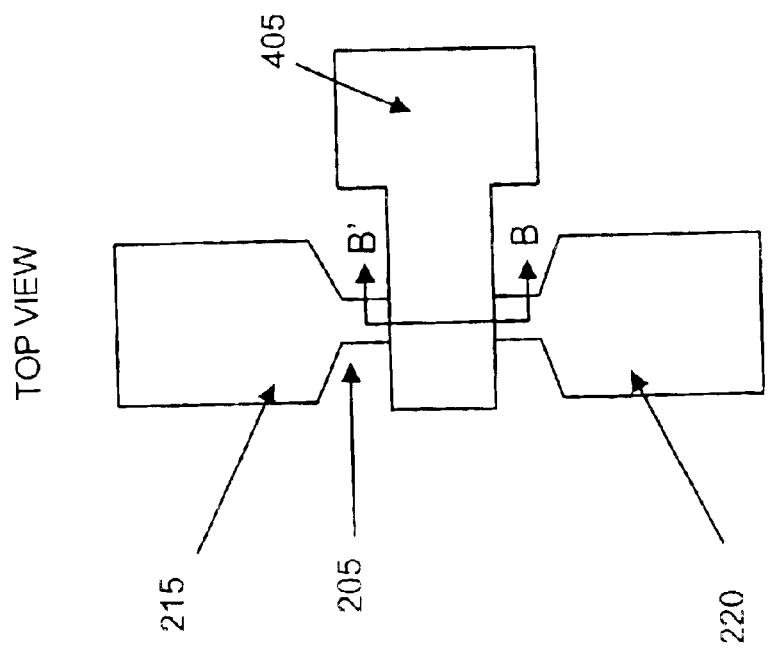

As further shown in FIG. 3B, a layer of polysilicon 310 may be formed over fin 205, source 210 and drain 215. The thickness of polysilicon layer 310 may range, for example, from about 500 Å to about 2000 Å. Polysilicon layer 310 may be polished back using, for example, a chemical-mechanical polishing (CMP) process, to achieve a planar surface to improve subsequent gate lithography. As shown in FIGS. 4A and 4B, a dummy gate 405 may be defined in polysilicon layer 310 using a conventional process, such as, for example, a conventional patterning and etching process.

Figure 5:
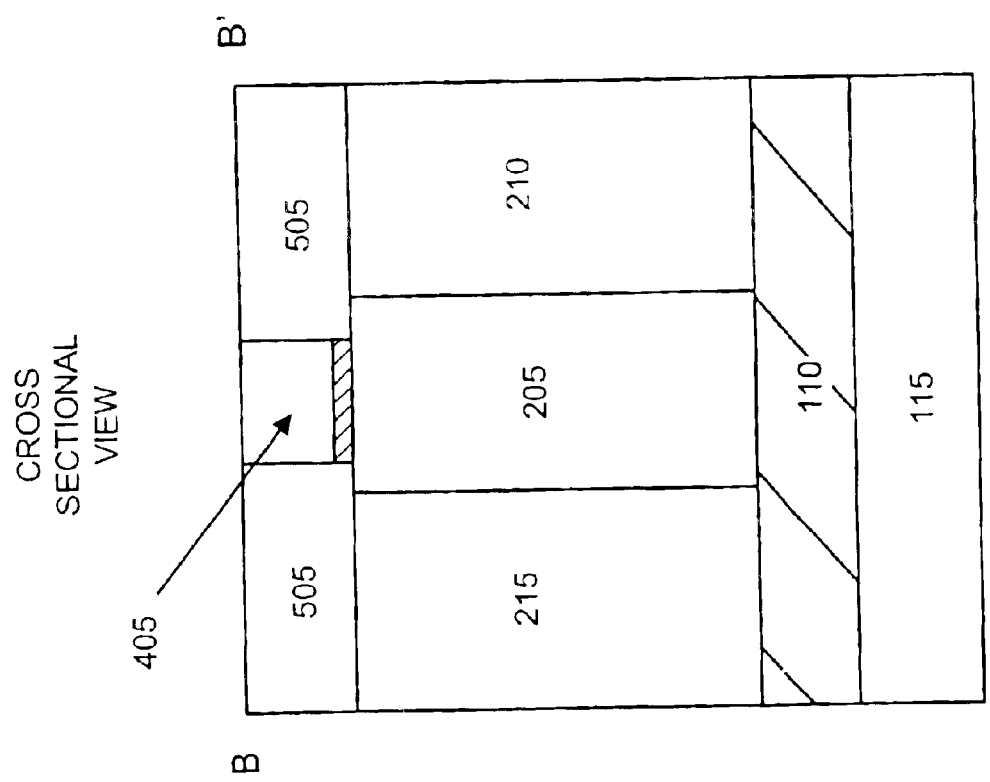
FIG. 5 illustrates the formation of a dielectric layer adjacent the dummy gate of FIGS. 4A and 4B consistent with the present invention.

As shown in FIG. 5, a dielectric layer 505 may be formed over dummy gate 405 using, for example, conventional deposition processes. Dielectric layer 505 may include, for example, tetraethylorthosilicate (TEOS), or any other dielectric material. The thickness of dielectric layer 505 may range, for example, from about 100 Å to about 300 Å. Dielectric layer 505 may then be polished back to the upper surface of dummy gate 405 using, for example, a CMP process, as illustrated in FIG. 5.

Figure 7:
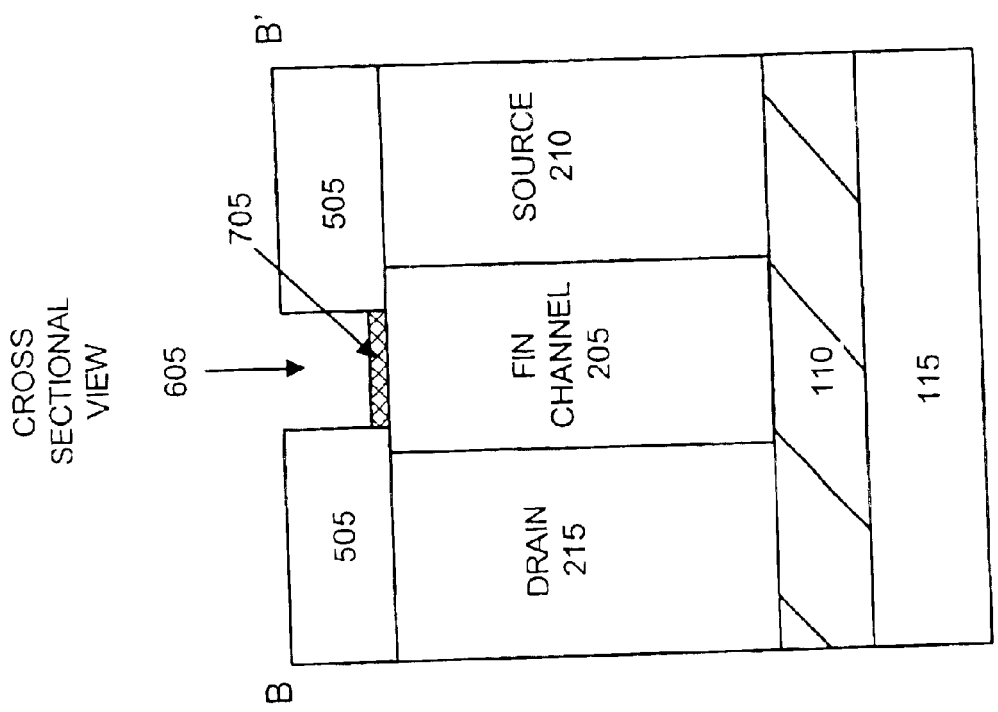
FIG. 7 illustrates formation of gate insulation within the gate trench of FIG. 6 consistent with the present invention.
Figure 6:
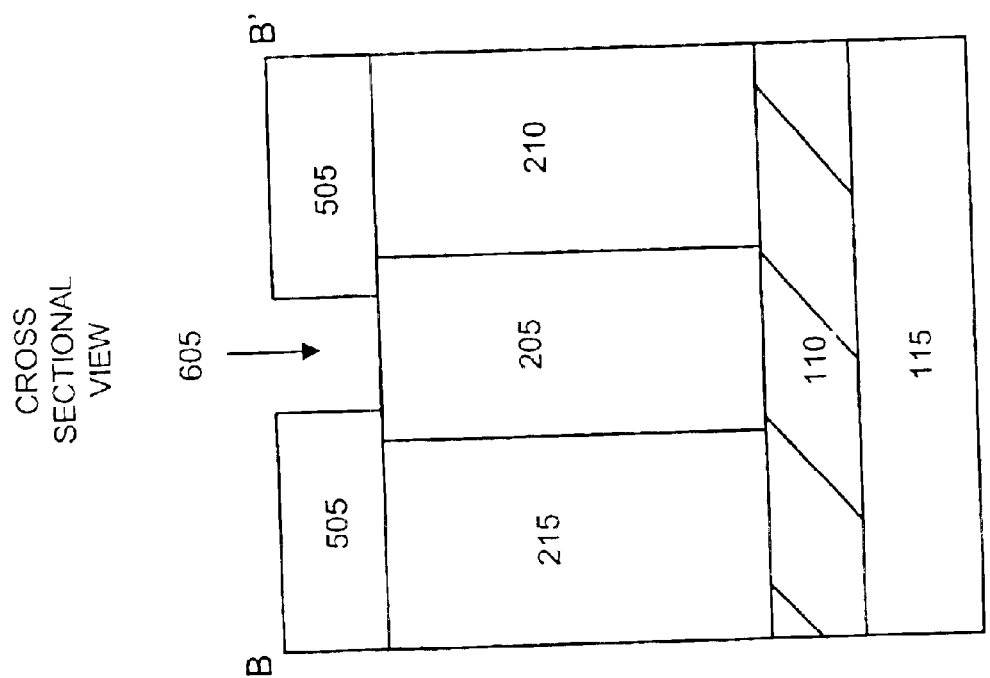
FIG. 6 illustrates the removal of the dummy gate of FIGS. 4A and 4B to form a gate trench consistent with the present invention.

Dummy gate 405 and dummy oxide 305 may then be removed, as shown in FIG. 6, leaving a gate trench 605. Dummy gate 405 and dummy oxide 305 may be removed using, for example, conventional etching processes. Gate insulation 705 may then be formed in gate trench 605, as shown in FIG. 7. Gate insulation 705 may be thermally grown or deposited using conventional deposition processes. Gate insulation 705 may include SiO, $SiO_2$, SiN, SiON, $HFO_2$, $ZrO_2$, $Al_2O_3$, HFSiO(x)ZnS, $MgF_2$, or other high-K dielectric materials. The thickness of gate insulation layer 705 may range, for example, from about 10 Å to about 50 Å.

Figure 8B:
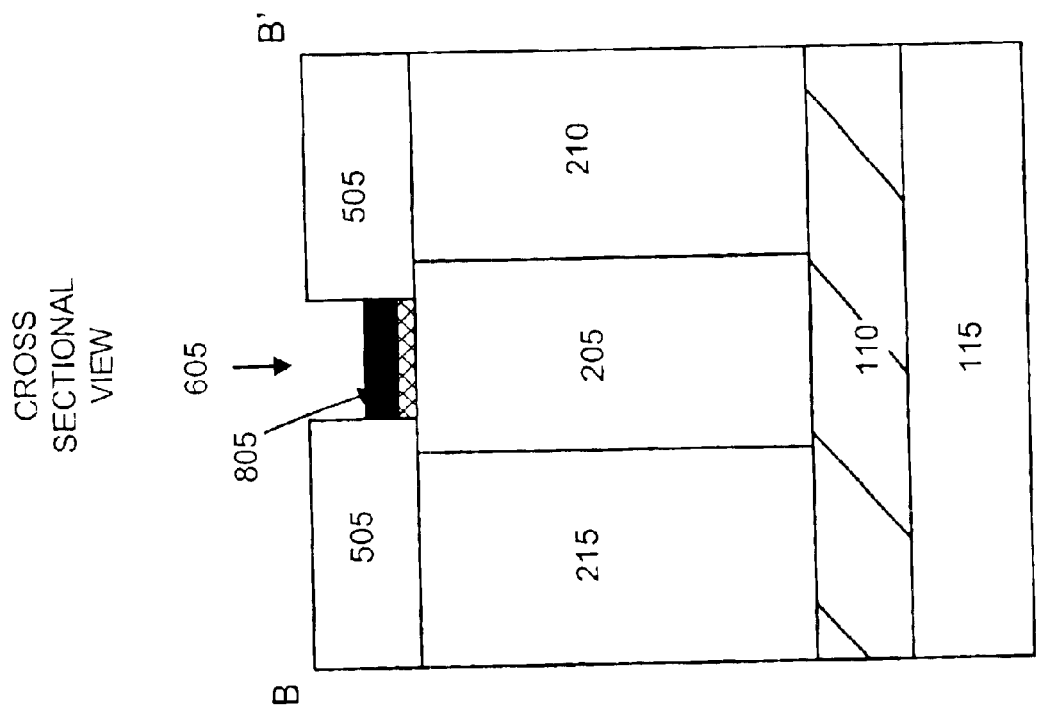
FIGS. 8A, 8B and 8C illustrate formation of a first metal gate layer within the gate trench of FIG. 7 consistent with the present invention.
Figure 8A:
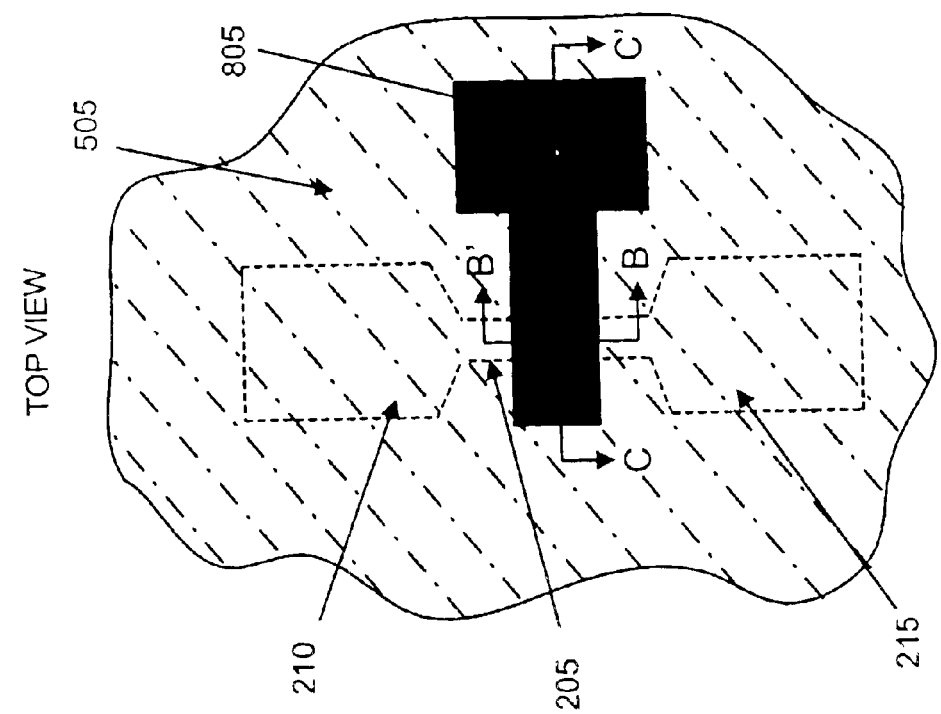
Figure 8C:
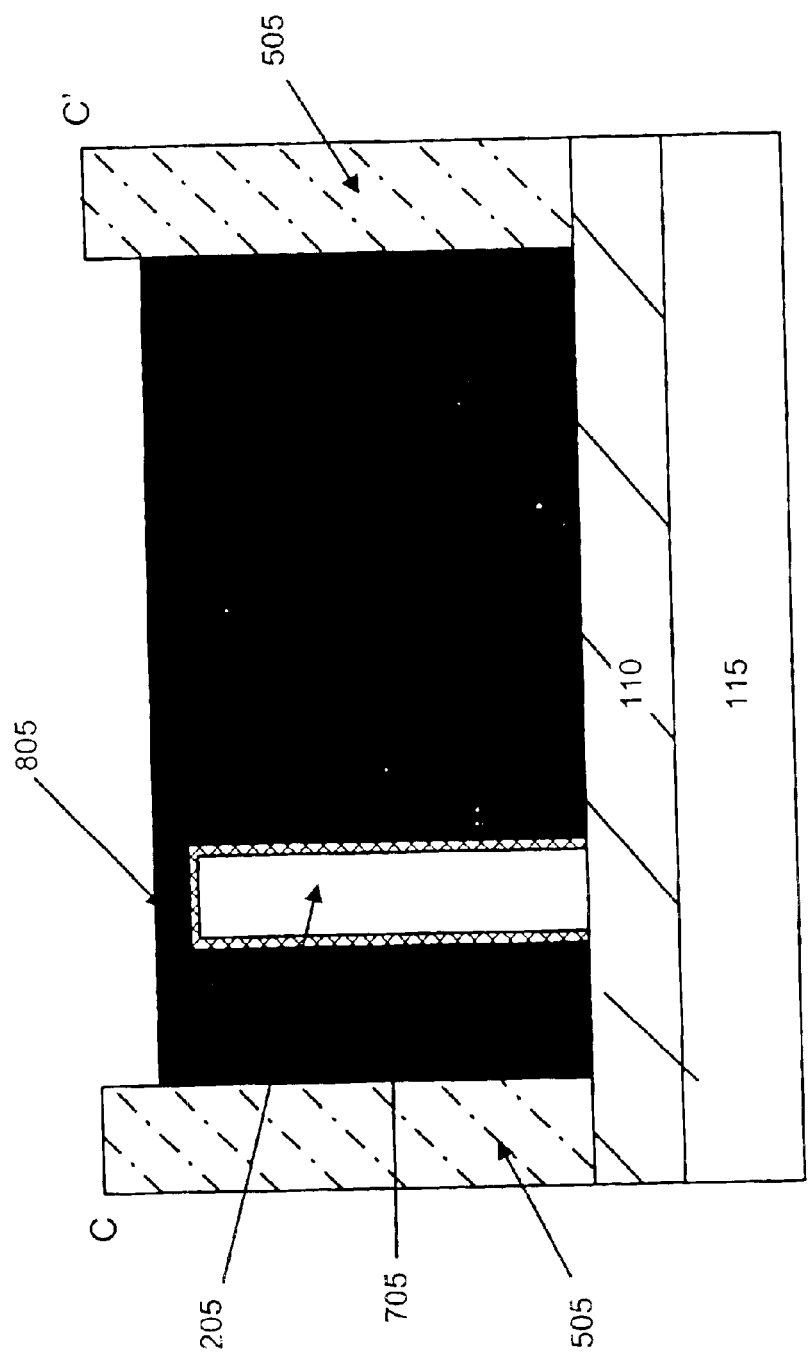

As shown in FIGS. 8A, 8B and 8C, a first metal material 805 may be formed in gate trench 605 over gate insulation 705. Metal material 805 may be formed in gate trench 605 using a conventional metal deposition process. Metal material 805 may include a metal material, such as, for example, Ti or Ni, though other metal materials may alternatively be used. The thickness of metal material 805 may range, for example, from about 300 Å to about 1000 Å.

Figure 9B:
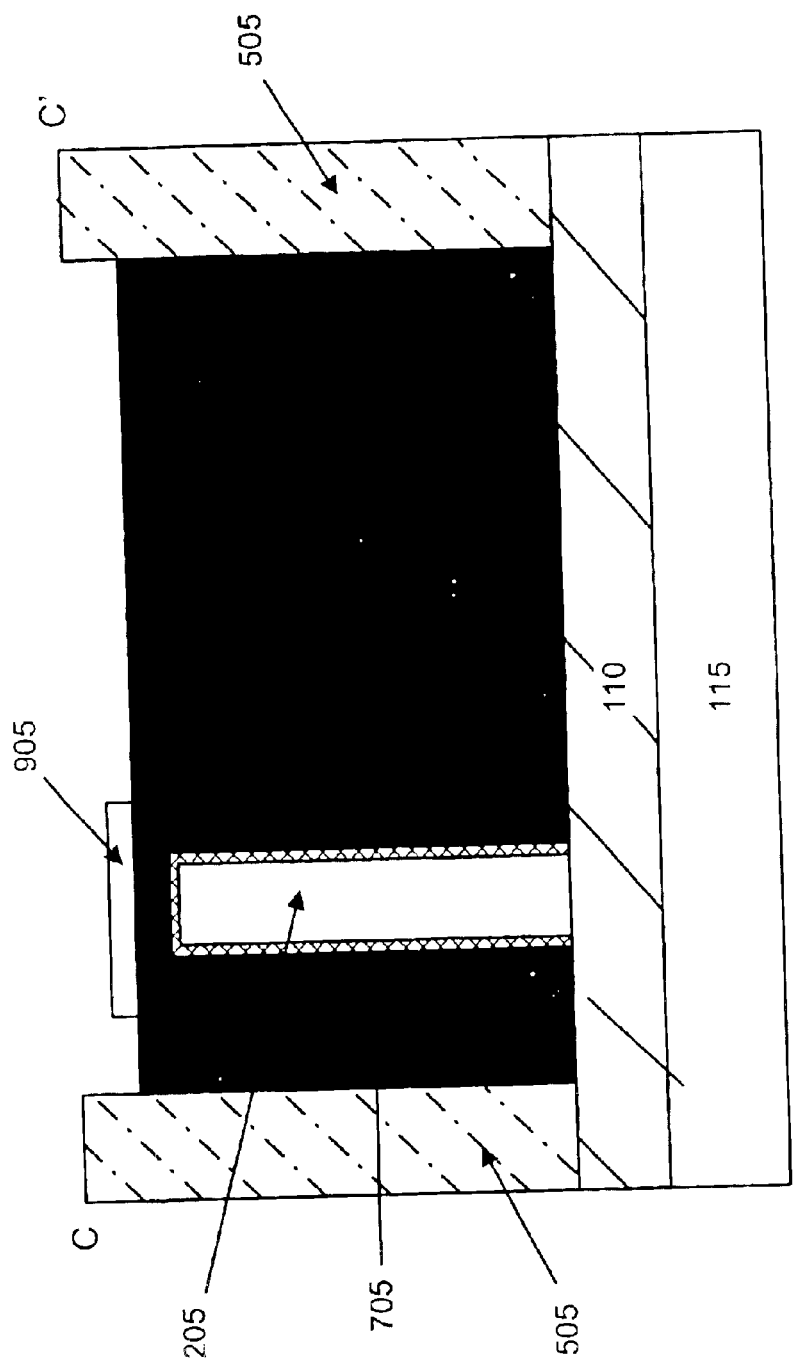
Figure 10:
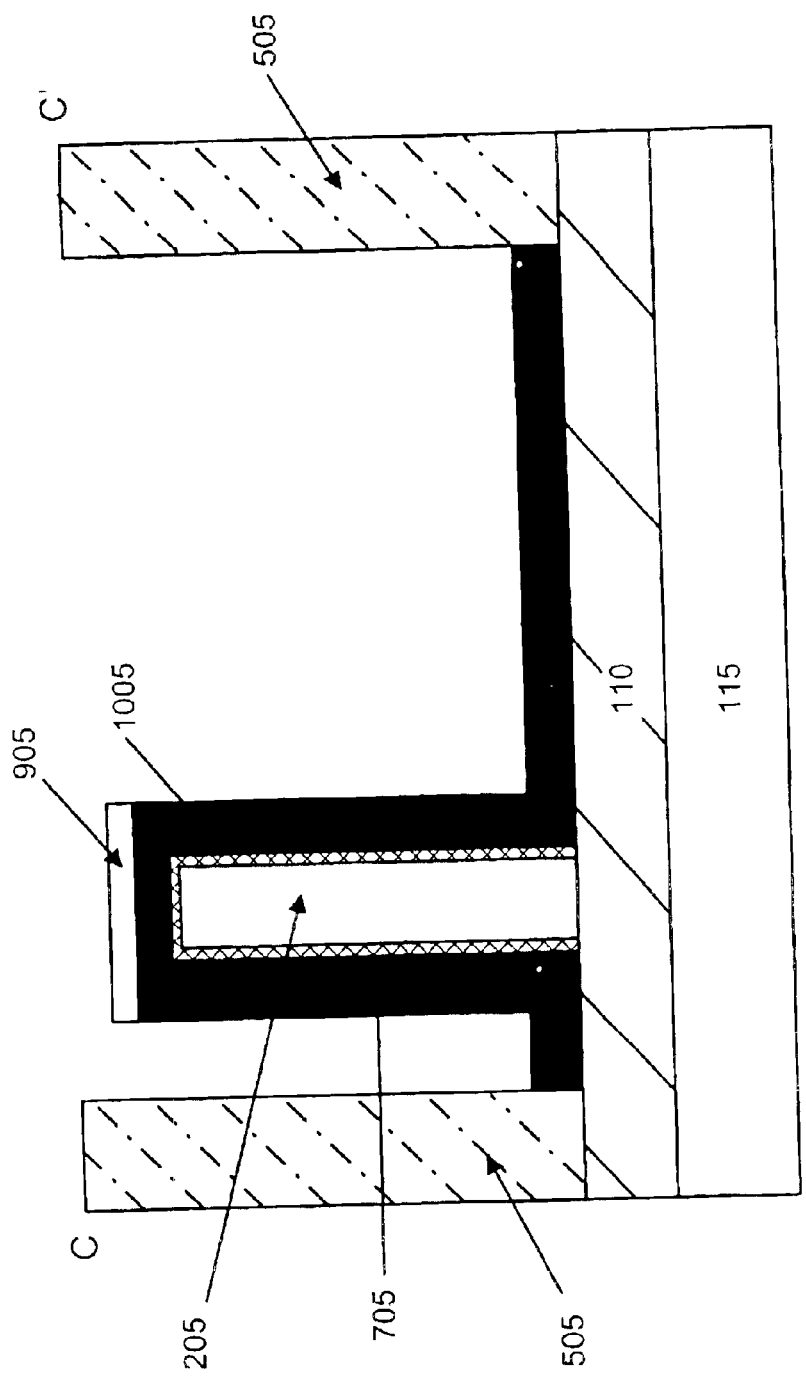
FIG. 10 illustrates etching of the first metal gate layer of FIGS. 9A and 9B consistent with the invention.

As further shown in FIGS. 9A and 9B, a photoresist pattern 905 may be formed over gate material 805. Using a conventional etching process, metal material 805 may be etched to form a first gate electrode 1005, as shown in FIG. 10. Photoresist pattern 905 may then be removed from first gate electrode 1005.

Figure 11B:
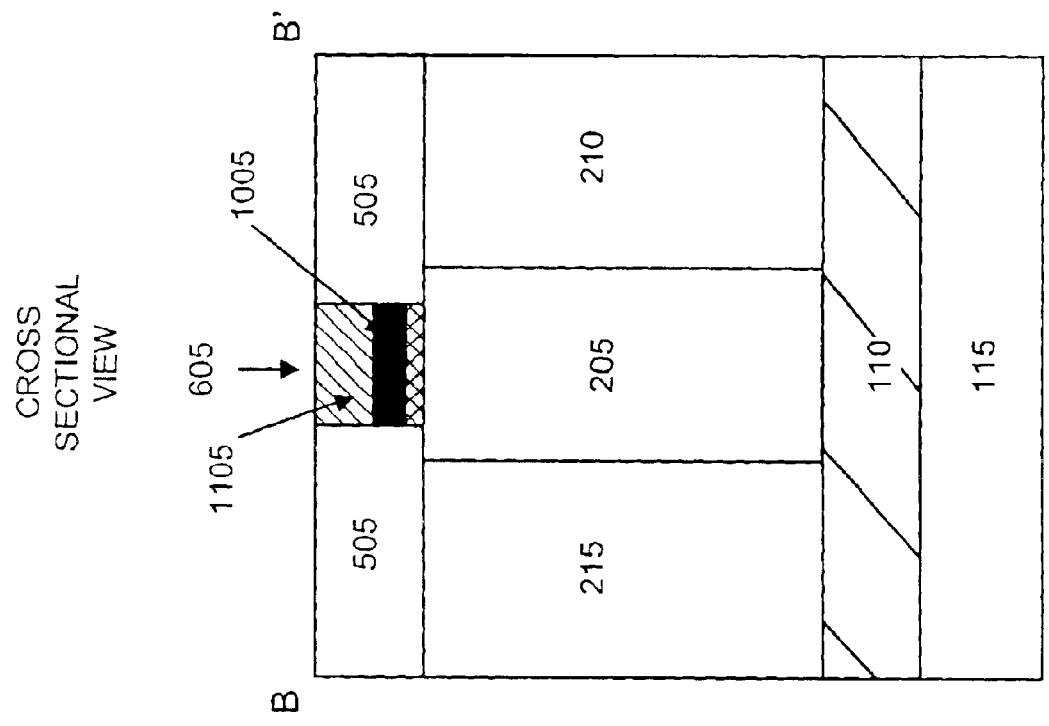
FIGS. 11A, 11B and 11C illustrate formation of a second metal gate layer within the gate trench of FIGS. 8A, 8B and 8C consistent with the present invention.
Figure 11A:
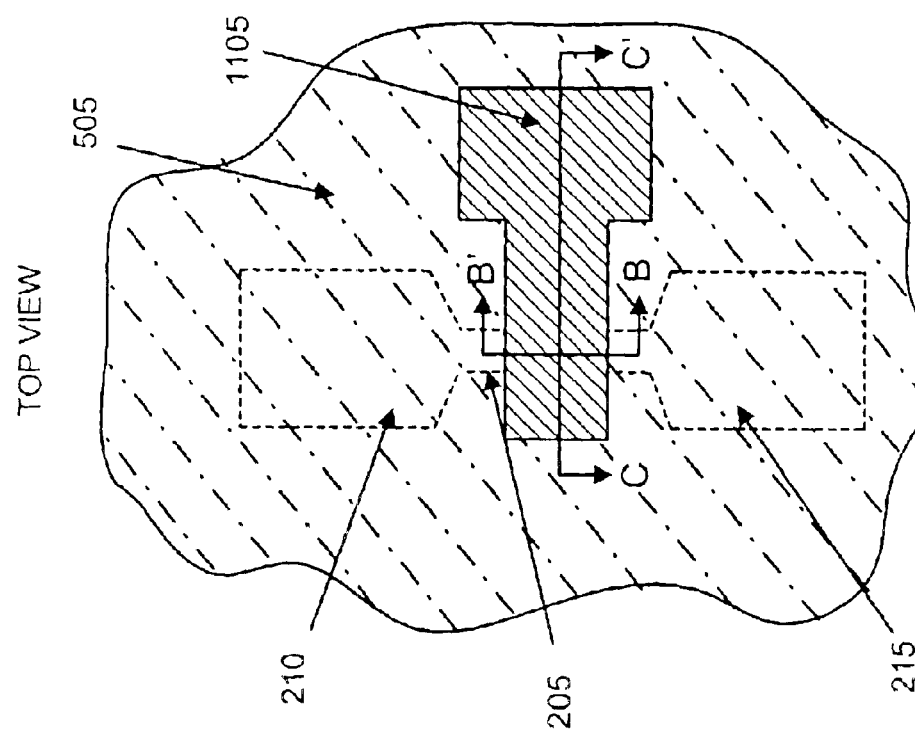
Figure 11C:
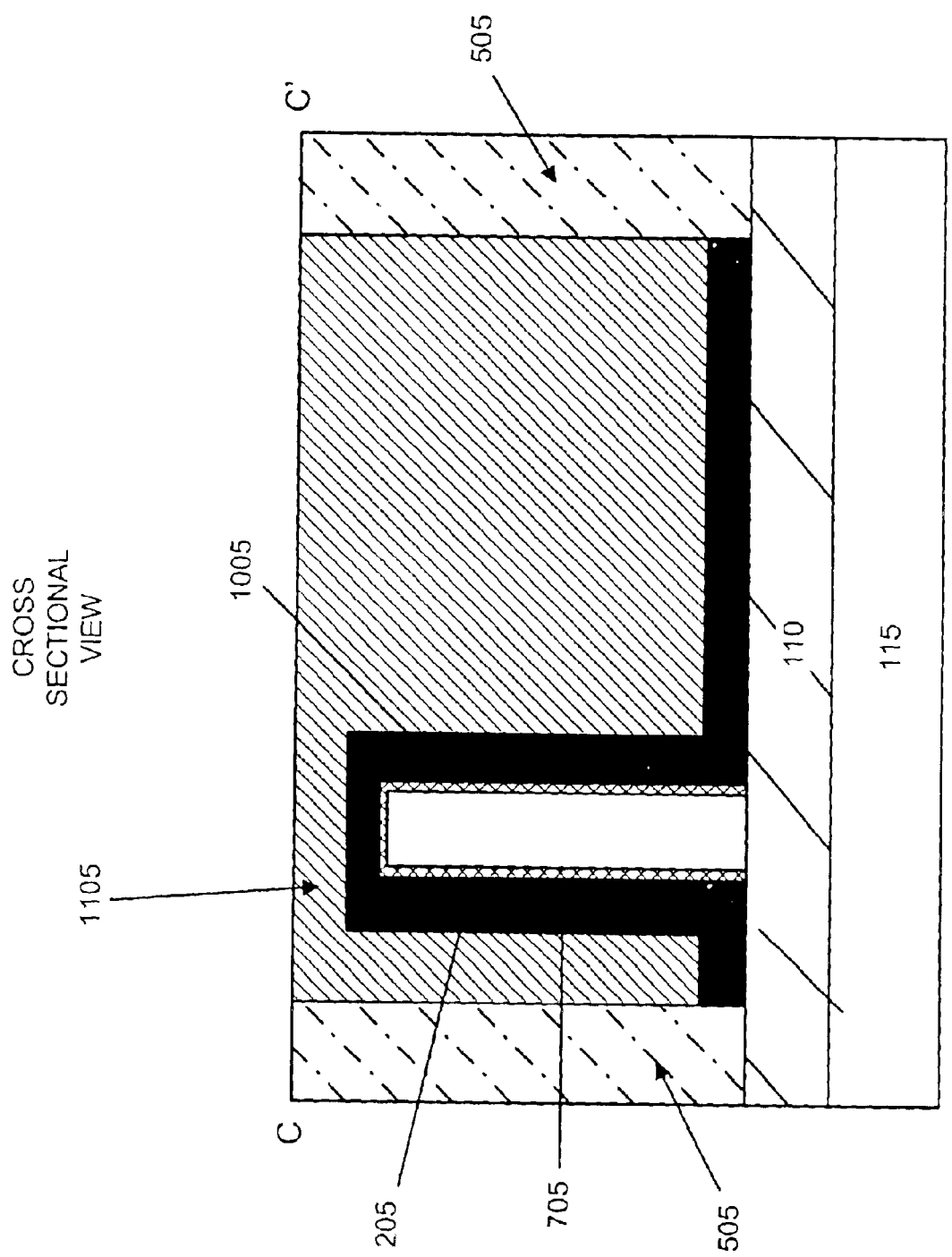

As shown in FIGS. 11A, 11B and 11C, a second metal material 1105 may be formed in gate trench 605 over first gate electrode 1005 to form a second gate electrode. Metal material 1105 may be formed in gate trench 605 using a conventional metal deposition process. Metal material 1105 may include a metal material, such as, for example, Ni or Ti, though other metal materials may alternatively be used. The thickness of metal material 1105 may range, for example, from about 300 Å to about 1000 Å.

Metal material 1105 may be selected such that it has a different work function than first metal material 805. For example, in one implementation, second metal material 1105 may be selected with a high work function, whereas first metal material 805 may be selected with a low work function. Due to diffusivity of the second metal material 1105 in the first metal material 805, after annealing, the second metal material 1105 may selectively diffuse through the first metal material to gate insulation 705. The use of different metals for forming adjacent gate electrodes over a fin may effectively create two FinFET devices with different threshold voltages ($V_t$). The first metal material 805 may be associated with a first threshold voltage ($V_{t1}$) and the second metal material 1105 may be associated with a second threshold voltage ($V_{t2}$). Selective metal interdiffusion, thus, achieves different gate work functions for different gate electrodes of a FinFET which, in turn, produces different voltage thresholds ($V_t$). A FinFET device with multiple voltage thresholds permits the optimization of drive current and/or leakage current for different circuit paths.

EXEMPLARY SELF-STOPPING POLY PLANARIZATION

Figure 12:
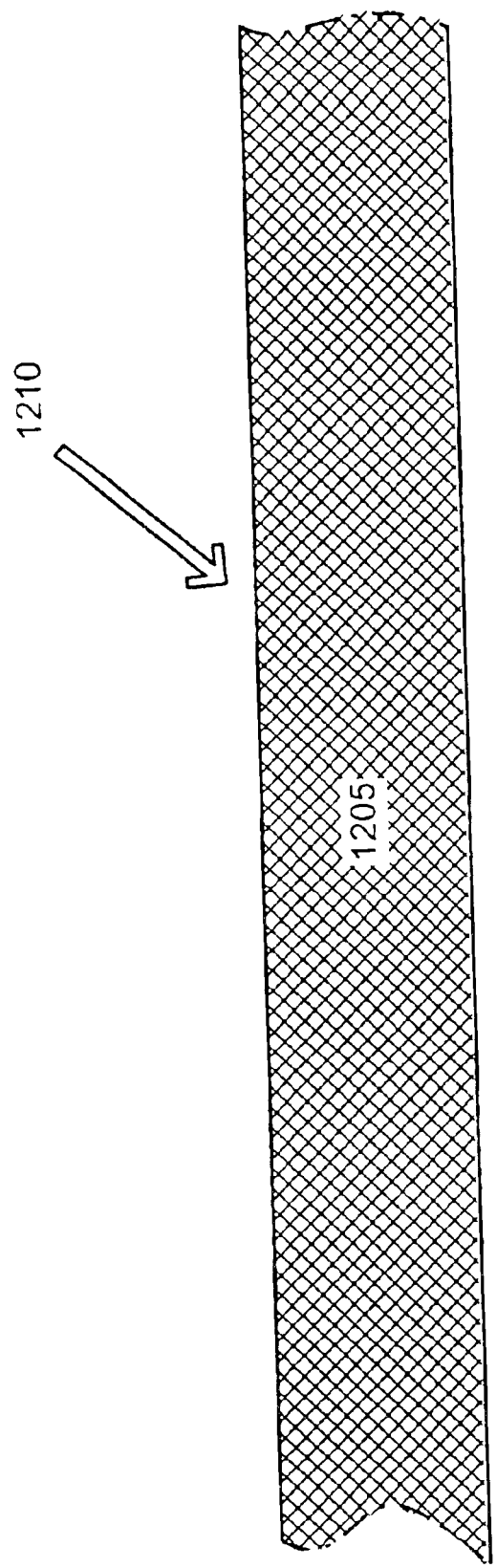
FIG. 12 illustrates formation of a crystalline silicon layer consistent with another embodiment of the invention.

FIGS. 12–15 illustrate an exemplary process for forming a stacked merged FET using metal induced crystallization, consistent with another embodiment of the present invention. As shown in FIG. 12, the exemplary process may begin with the formation of a layer 1205 of amorphous silicon (α-Si) material. Layer 1205 may be formed, for example, using conventional deposition processes and may range, for example, from about 300 Å to about 1000 Å in thickness. The amorphous silicon of layer 1205 may then be annealed to convert the amorphous silicon to crystalline silicon via metal induced crystallization (MIC). Subsequent to MIC, layer 1205 may be implanted with an n channel material 1210 to produce an n type FET channel. n channel material 1210 may include, for example, Si, Ge, or SiGe, and may be implanted to a doping/concentration level that may range, for example, from about $10^{15}$ cm$^{-3}$ to about $10^{17}$ cm$^{-3}$.

Figure 13:
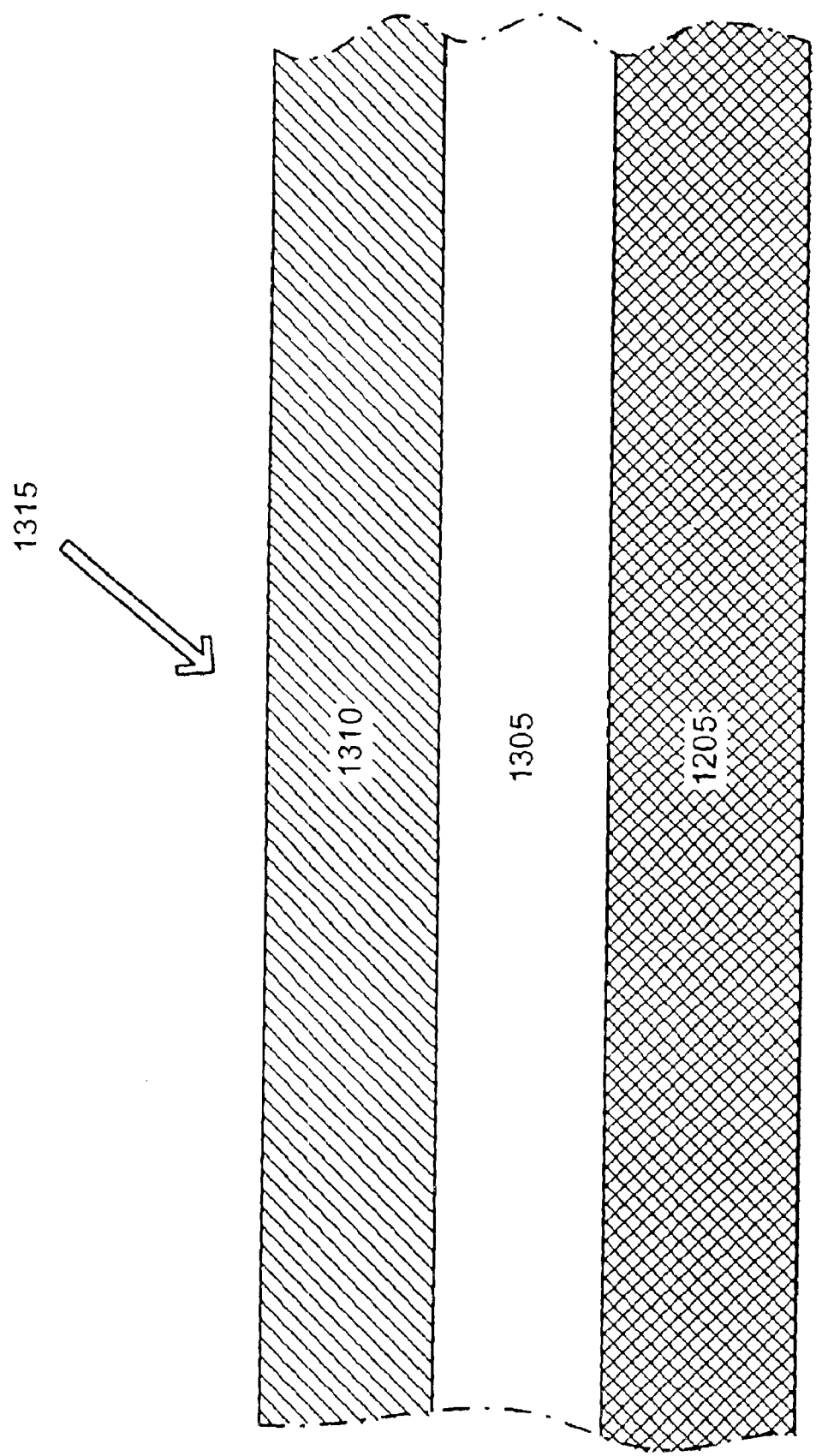
FIG. 13 illustrates formation of an oxide layer and an amorphous silicon layer over the crystalline silicon layer of FIG. 12 consistent with the other embodiment of the invention.

Subsequent to n channel implantation, an oxide layer 1305 may be formed on layer 1205, as shown in FIG. 13.

Oxide layer 1305 may include an oxide, such as, for example, silicon oxide and may range, for example, from about 300 Å to about 1000 Å in thickness. In one implementation, for example, oxide layer 1305 may be thermally grown on layer 1205. A layer 1310 of amorphous silicon (α-Si) material may then be formed on oxide layer 1305. Layer 1310 may be formed, for example, using conventional deposition processes and may range, for example, from about 300 Å to about 1000 Å in thickness. Subsequent to formation, layer 1310 may be implanted with a p channel material 1315, such as, for example, Si, Ge, or SiGe, to a doping/concentration level that may range, for example, from about $10^{15}$ cm$^{-3}$ to about $10^{17}$ cm$^{-3}$.

Figure 14:
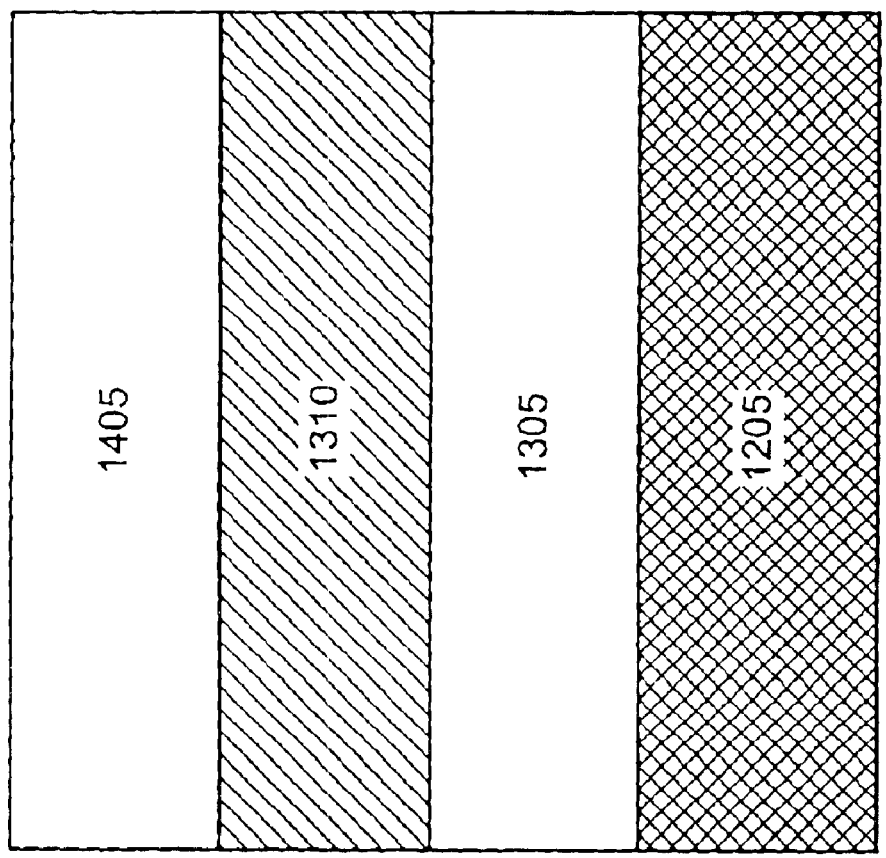
FIG. 14 illustrates formation of an oxide layer on the amorphous silicon layer of FIG. 13 consistent with the other embodiment of the invention.

As shown in FIG. 14, an oxide layer 1405 may be formed on layer 1310. Oxide layer 1405 may include an oxide, such as, for example, silicon oxide and may range, for example, from about 300 Å to about 1000 Å in thickness. In one implementation, for example, oxide layer 1405 may be thermally grown on layer 1310. Layers 1205, 1305, 1310 and 1405 may then be formed into a stack, as shown in FIG. 14, using a conventional patterning and etching process.

Figure 15:
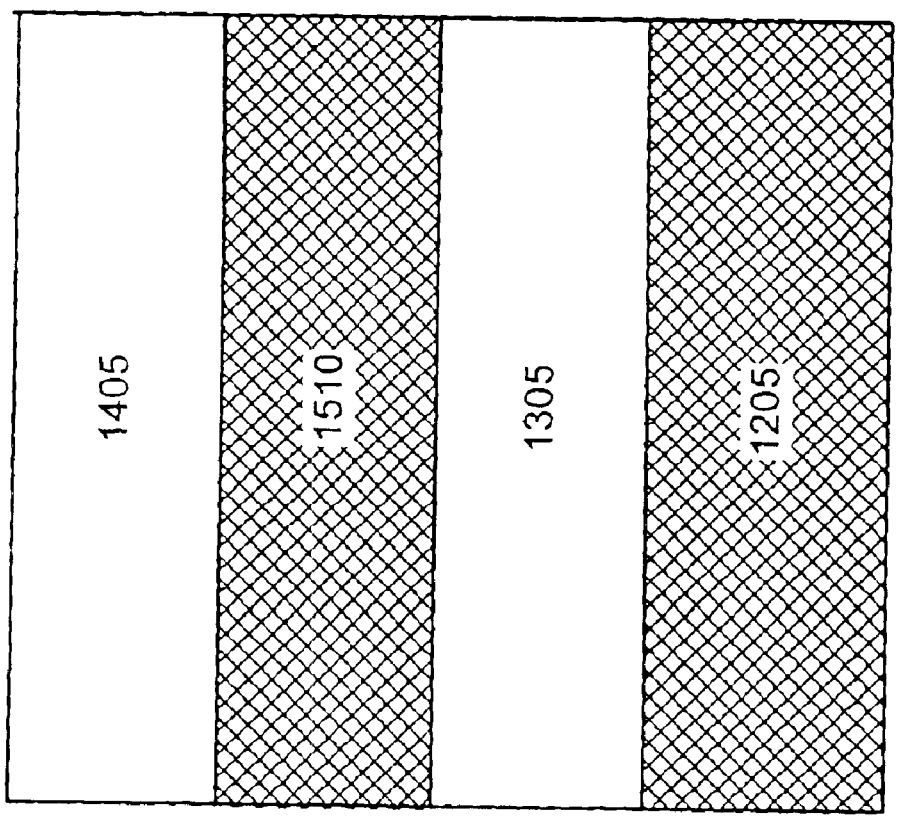
FIG. 15 illustrates formation of a stacked merged FET via metal induced crystallization consistent with the other embodiment of the invention.

The amorphous silicon of layer 1310 may then be annealed to convert the amorphous silicon to crystalline silicon, via MIC, to produce a p-type crystalline silicon layer 1510, as illustrated in FIG. 15. Creation of the n-type crystalline silicon layer 1205 and the p-type crystalline silicon layer 1510, thus, produces a stacked, merged FET consistent with another embodiment of the invention.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts has been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one " similar language is used. The scope of the invention is defined by the following claims and their equivalents.

What is claimed is:

1. A fin field effect transistor, comprising:
   a fin comprising a channel;
   a source region formed adjacent a first end of the fin;

a drain region formed adjacent a second end of the fin;

a first layer of metal material comprising a first gate electrode, wherein the first layer of metal material is formed adjacent the fin; and a second layer of metal material formed adjacent the first layer, the second layer of metal material comprising a second gate electrode, wherein the first layer of metal material comprises a different work function than the second layer of metal material, wherein the second layer of metal material is selectively diffused into the first layer of metal material via metal interdiffusion.

2. The transistor of claim 1, wherein the first layer of metal material comprises Ti or Ni.

3. The transistor of claim 2, wherein the second layer of metal material comprises Ni or Ti.

4. The transistor of claim 1, further comprising:

a gate insulation layer formed between the fin and the first layer of metal material.

5. The transistor of claim 4, wherein the gate insulation layer comprises at least one of SiO, $SiO_2$, SiN, SiON, $HFO_2$, $ZrO_2$, $Al_2O_3$, HFSiO(x) ZnS, and $MgF_2$.

6. The transistor of claim 1, wherein the first layer of metal material has a thickness ranging from about 300 Å to about 1000 Å.

7. The transistor of claim 6, wherein the second layer of metal material has a width ranging from about 300 Å to about 1000 Å.

8. A method of forming a multiple voltage threshold fin field effect transistor (FinFET), comprising:

forming a fin;

forming a source region adjacent a first end of the fin and a drain region adjacent a second end of the fin;

forming a dummy gate comprising a first material in a first pattern over the fin;

forming a dielectric layer adjacent sides of the dummy gate;

removing the first material to form a trench in the dielectric layer corresponding to the first pattern;

forming a first metal gate layer in the trench, wherein the first metal gate layer comprises a first metal material; and forming a second metal gate layer in the trench adjacent the first metal gate layer, wherein the second metal gate layer comprises a second metal material and wherein the second metal material selectively diffuses through the first metal material via metal interdiffusion to produce a multiple voltage threshold FinFET.

9. The method of claim 8, wherein the dielectric layer comprises tetraethylorthosilicate.

10. The method of claim 8, further comprising:

forming a gate insulation layer in the trench prior to forming the first metal gate layer.

11. The method of claim 10, wherein the gate insulation layer comprises at least one of SiO, $SiO_2$, SiN, SiON, $HFO_2$, $ZrO_2$, $Al_2O_3$, HFSiO(x) ZnS, and $MgF_2$.

12. The method of claim 8, wherein forming the dummy gate comprises:

depositing a layer of polysilicon over the fin; and etching the polysilicon layer to form the dummy gate in the first pattern.

13. The method of claim 8, wherein forming the first metal gate layer comprises:

depositing the first metal material in the trench to a thickness ranging from about 300 Å to about 1000 Å.

14. The method of claim 13, wherein forming the second metal gate layer comprises:

depositing the second metal material adjacent the first metal material in the trench to a thickness ranging from about 300 Å to about 1000 Å.

15. A method of forming a fin field effect transistor comprising a fin and a source region adjacent a first end of the fin and a drain region adjacent a second end of the fin, the method comprising:

forming a dummy oxide layer over the fin;

depositing a layer of first material over the fin and dummy oxide layer;

etching the layer of the first material to form a dummy gate in a first pattern;

depositing a dielectric layer over the dummy gate and source and drain regions;

planarizing the dielectric layer to expose a top surface of the dummy gate;

removing the first material to form a trench in the dielectric layer corresponding to the first pattern;

forming a gate insulation layer in the trench;

forming a first gate layer in the trench, the first gate layer comprising a first metal material, wherein the first metal material comprises a first work function; and forming a second gate layer in the trench, the second gate layer comprising a second metal material, wherein the second metal material comprises a second work function.

16. The method of claim 15, wherein the first work function is different than the second work function.

17. The method of claim 15, wherein forming the first gate layer comprises:

depositing the first metal material in the trench to a thickness ranging from about 300 Å to about 1000 Å, and wherein forming the second gate layer comprises:

depositing the second metal material adjacent the first metal material in the trench to a thickness ranging from about 300 Å to about 1000 Å.

18. The method of claim 15, wherein the first material comprises polysilicon.

19. The method of claim 15, wherein the gate insulation layer comprises at least one of SiO, $SiO_2$, SiN, SiON, $HFO_2$, $ZrO_2$, $Al_2O_3$, HFSiO(x) ZnS, and $MgF_2$.

* * * * *